United States Patent [19]

Yamamoto et al.

[11] Patent Number: 5,031,022
[45] Date of Patent: Jul. 9, 1991

[54] FILM CARRIER FOR MOUNTING IC CHIPS

[75] Inventors: Toshio Yamamoto; Tamio Saito; Naoharu Ohikata; Jiro Ohno, all of Tokyo; Michio Osada, Uji, all of Japan

[73] Assignees: Nippon Steel Corporation, Tokyo; Towa Corporation, Kyoto, both of Japan

[21] Appl. No.: 515,406

[22] Filed: Apr. 27, 1990

[30] Foreign Application Priority Data

May 2, 1989 [JP] Japan ................................ 1-113365

[51] Int. Cl.$^5$ .................... H01L 23/48; H01L 23/28; H05K 5/02; H01G 1/14
[52] U.S. Cl. ........................................ 357/70; 357/72; 361/421; 361/520
[58] Field of Search ............................ 357/70, 72, 69; 361/421, 520

[56] References Cited

U.S. PATENT DOCUMENTS 4,218,701  8/1980  Shirasaki .............................. 357/70

Primary Examiner—Mark Prenty
Attorney, Agent, or Firm—Wenderoth, Lind & Ponack

[57] ABSTRACT

An IC chip is packaged on a film carrier. The film carrier comprises an insulation film and many conductive leads formed on the insulation film in predetermined patterns. Each of the leads has an inner lead portion to be connected to a terminal of the IC chip, and an outer lead portion to be connected to a conductive pattern of a mounting board. The film carrier further comprises an embankment, which is made of insulation material and formed on and/or in the vicinity of the outer lead portions of the leads to prevent an ooze of resin when the IC chip is sealed with the resin.

18 Claims, 3 Drawing Sheets

FILM CARRIER FOR MOUNTING IC CHIPS

BACKGROUND OF THE INVENTION

1. Field of the Invention

The present invention relates to a film carrier employed in mounting IC chips, and particularly to a film carrier preferably used for TAB (Tape Automated Bonding).

2. Description of the Related Art

TAB is one of the known IC mounting techniques as disclosed in "MICRO ELECTRONICS PACKAGING HANDBOOK, P423, Edited by Rao R. Tummala et al. VAN NOSTRAND, 1989". In conventional TAB, IC chips are fixed through many conductive leads formed in a predetermined pattern on a film carrier comprising a long film substrate made of insulating material such as polyimide resin. A support ring made of the same material as the film substrate is formed around each IC chip to support the conductive leads. The IC chip is sealed (packaged) with resin using a potting method.

If upper and lower resin layers are not sufficiently set together in sealing the IC chip, the resin layer may be separated or cracked in later processing stages. If a boundary between the sealing resin (usually epoxy resin) and the other parts such as a polyimide film substrate of the support ring and the IC chip is exposed, moisture may penetrate the resin through the boundary to crack the resin, or the difference between thermal expansion coefficients of the materials around the boundary may create cracks in the resin.

To cope with this, a transfer mold method has been recently employed to perfectly seal the support ring and the IC chip. This method can solve the above problems and accurately define the shape and size of an IC package.

To sufficiently fill a mold employed by the transfer mold method with resin and to let the resin sufficiently penetrate gaps between outer lead portions of the conductive leads, the resin must have a low viscosity.

If the IC chip packaged on the carrier film has many pins, a gap between the adjacent leads will be very narrow. The resin will then ooze due to capillarity between the outer lead portions. This extremely degrades the appearance and commercial value of the IC package. In addition, the oozed resin may be carbonized in later processing stages to reduce or eliminate the insulation between the leads.

This sort of ooze also occurs in the potting method.

To deal with this problem, metal molds at least one of which has a surface matching the outer lead portions are used so that, when the metal molds are joined together at the bases of the outer lead portions, the metal molds will fill gaps between the outer lead portions, thereby preventing the resin from oozing.

This method, however, requires complicated metal molds which increase the cost of the packaging process. In addition, if patterns of the leads are changed, new metal molds must be prepared for the changed patterns.

SUMMARY OF THE INVENTION

An object of the present invention is to provide a film carrier for mounting IC chips that can effectively prevent an oozing of resin in a resin sealing process.

To achieve the object, the present invention provides a film carrier for mounting an IC chip, comprising an insulation film; a plurality of conductive leads formed on the insulation film, each of the conductive leads having an inner lead portion to be connected to a terminal of the IC chip, and an outer lead portion to be connected to a terminal of a mounting material, and an embankment made of insulation material and formed on or in the vicinity of the outer lead portions of the conductive leads to prevent an oozing of resin when the IC chip is sealed with the resin.

BRIEF DESCRIPTION OF THE DRAWINGS

These and other objects, features and advantages of the present invention will be more apparent from the following detailed description of preferred embodiments in conjunction with the accompanying drawings, in which.

DESCRIPTION OF THE PREFERRED EMBODIMENTS

The embodiments of the present invention will be explained with reference to FIGS. 1 to 4.

Figure 1:
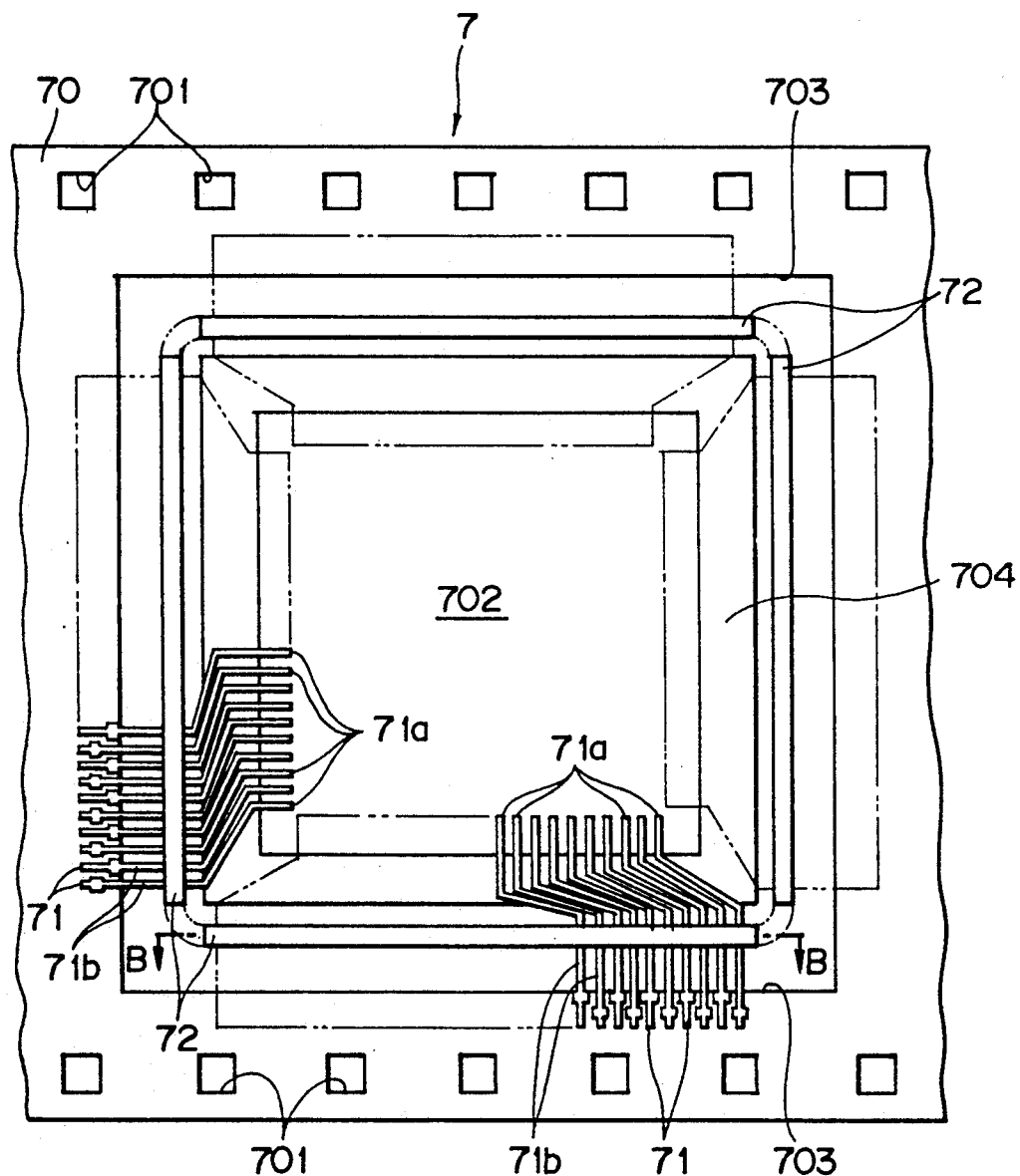
FIG. 1 is a plan view showing a film carrier according to an embodiment of the present invention.

As shown in FIG. 1, a film carrier 7 according to the first embodiment of the present invention comprises a polyimide insulation film 70, and many conductive leads 71 formed by photo-etching a copper foil adhered to the insulation film 70 in predetermined patterns.

The insulation film 70 is made of resin such as polyimide resin, glass epoxy resin, BT resin, and polyester resin. The leads 71 may also be formed according to a plating method such as an electroless plating method and an electrodeposition method. Instead of copper, covar may be used to form the leads 71.

The insulation film 70 has sprocket holes 701, device receiving holes 702, and outer lead holes 703, similar to the conventional insulation film. These holes are formed by punching, etc. A support ring 704 is formed between each of the device receiving holes 702 and each of the outer lead holes 703.

Each of the leads 71 comprises an inner lead portion 71a disposed inside the support ring 704, and an outer lead portion 71b disposed outside the support ring 704 and defined by the outer lead hole 703.

A polyimide embankment 72 is formed on or in the vicinity of the outer lead portions 71b of the leads 71.

The embankment 72 is formed of insulation material such as polyimide resin, according to a screen printing method. It is possible to make the embankment 72 with ceramics or other composite materials.

In this embodiment, the leads 71 of the film carrier 7 are formed along each side of the device hole 702 having a substantially square shape, and the embankment 72 is disposed along each side of the device hole 702 in solid contact with the leads 71 of the corresponding side. Namely, four embankments 72 are disposed around each device hole 702.

Figure 2A:
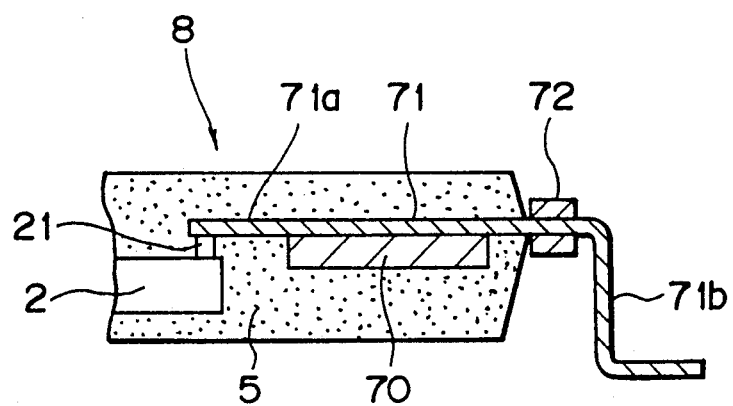
FIG. 2A is an enlarged section showing a packaged IC chip with a formed outer lead portion.
Figure 2B:
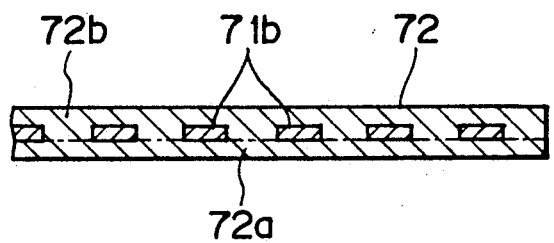
FIG. 2B is a sectional view taken along a line B—B of FIG. 1.

As shown in FIG. 2B, the embankment 72 must completely seal gaps between the outer lead portions 71b.

Therefore, the embankment 72 must be formed from the tops and bottoms of the outer lead portions 71b.

A part 72a (FIG. 2B) of the embankment 72 on the same side as the support ring 704 is formed at the same time when the support ring 704 is formed. Thereafter, a remaining part 72b is screen-printed from the other side to fill the gaps between the outer lead portions 71b.

The embankment 72 may be formed independently of the support ring 704. In this case, both the parts 72a and 72b of the embankment 72 are screen-printed on both faces of the outer lead portions 71b. This method is preferable particularly when the embankment 72 is made of a material different from a material of the insulation film 70.

The embankment 72 is located on the bases of the outer lead portions 71b external to the support ring 704. If an IC chip is sealed with resin according to the transfer mold method, the embankment 72 will be located just outside a metal mold employed by the transfer mold method.

An IC package 8 sealed with the resin is cut from the film carrier 7 at edges of the outer lead portions 71b as shown in FIG. 2A. Thereafter, the outer lead portions 71b are bent just outside the embankment 72 in a gull wing shape, and the packaged IC chip is mounted on a predetermined mounting board.

To prevent the embankment 72 from being displaced when the outer lead portions 71b are bent, the four embankments 72 around each device hole 702 may be connected to each other as indicated with dot-and-dash lines in FIG. 1.

The support ring 704 adopted in this embodiment is not essential, and may be omitted. In this case, the device hole 702 and outer lead hole 703 are formed as one continuous hole, so that a boundary between the inner lead portions 71a and the outer lead portions 71b may not be defined clearly.

In such a case, the embankment 72 must be formed at a location which is recognized as or in the vicinity of the outer lead portions 71b of the leads 71, and the IC chip 2 must be sealed with resin on the inside of the embankment 72. In other words, the embankment 72 is arranged outside the resin sealed IC package, on or in the vicinity of the outer lead portions 71b of the leads 71.

Figure 3:
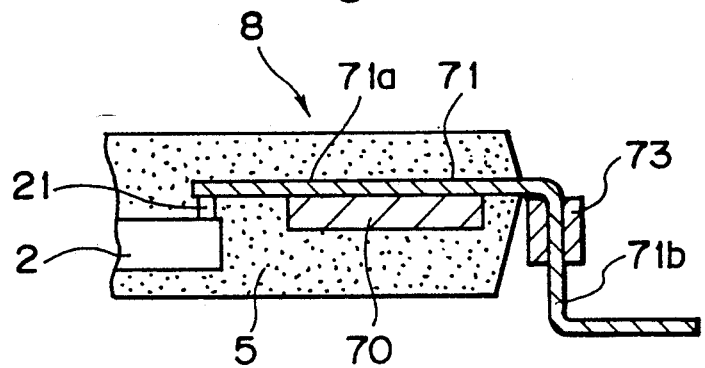
FIG. 3 is a sectional view showing a packaged IC chip according to another embodiment of the present invention.
Figure 4:
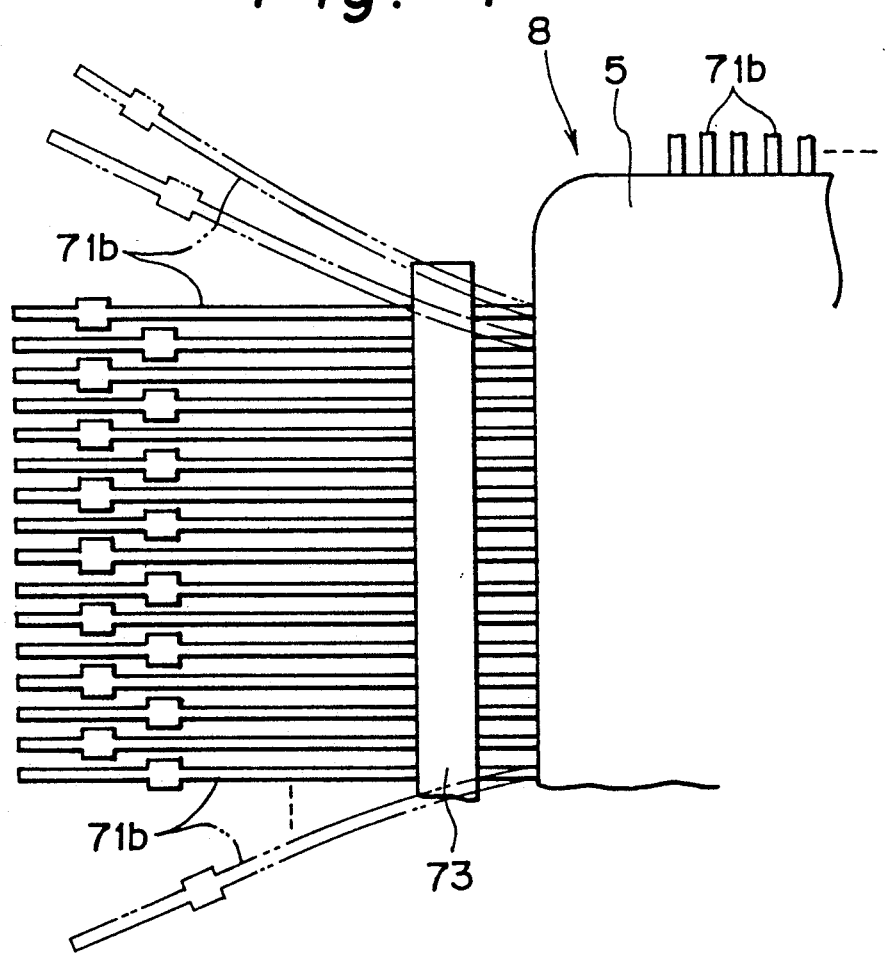
FIG. 4 is a plan view showing a part of the packaged IC of FIG. 3.

FIGS. 3 and 4 are views showing the second embodiment of the present invention.

In this embodiment, an embankment 73 is spaced apart from an outer edge of a resin sealed IC package 8 by a distance of about 0.5 mm. Outer lead portions 71b are bent on the inside of the embankment 73 into a shape shown in FIG. 3.

According to the second embodiment, when the outer lead portions 71b are bent, or when the IC package 8 is bonded to a board, the embankment 43 prevents to some extent the displacement of the outer lead portions 71b as shown in FIG. 4.

A method of forming the embankment 73 and the arrangement of the film carrier 7, etc., of the second embodiment may be the same as those of the first embodiment.

As explained above, according to the present invention, an embankment is arranged on outer lead portions of leads on a film carrier to prevent an oozing of resin when IC chips on the film carrier are sealed with the resin. Even if a conventional method is employed in sealing the IC chips with the resin, the embankment can prevent the resin from oozing through gaps between the outer lead portions.

The present invention improves the appearance of each IC chip, and prevents a carbonization of oozed resin that may reduce or eliminate the insulation between the leads.

The present invention is applicable for a conventional film carrier with only a slight change in the conventional film carrier and with substantially the same IC packaging process as the conventional one, so that a production line, etc., need not be greatly changed to utilize the present invention. Therefore, the present invention is easily and widely applicable.

We claim:

1. A film carrier for mounting an IC chip, comprising:
   an insulation film;
   a plurality of conductive leads formed on said insulation film, each of said conductive leads having an inner lead portion to be connected to a terminal of the IC chip, and an outer lead portion to be connected to a terminal of a mounting material; and
   an embankment made of insulation material and formed on or in the vicinity of the outer lead portions of said conductive leads to prevent an oozing of resin when the IC chip is sealed with a resin.

2. A film carrier as claimed in claim 1, wherein said embankment extends intermittently around the periphery of said IC chip on the outer portions of said conductive leads.

3. A film carrier as claimed in claim 1, wherein said embankment extends continuously around the entire periphery of said IC chip on the outer lead portions of said conductive leads.

4. A film carrier as claimed in claim 1, wherein said embankment is spaced outwardly of the resin on the IC chip on the outer lead portions of said conductive leads.

5. A film carrier as claimed in claim 1, wherein said embankment is formed on both the top and bottom sides of the outer lead portions.

6. A film carrier as claimed in claim 5, wherein said embankment has a bottom part formed at the same time as a support ring for supporting said conductive leads is formed, and a top part formed on the top side of the outer lead portions.

7. A film carrier as claimed in claim 5, wherein said embankment is formed independently of a support ring for supporting said leads.

8. A film carrier as claimed in claim 6, wherein said embankment is made of the same material as the support ring.

9. A film carrier as claimed in claim 7, wherein said embankment is made of different material from the support ring.

10. A film carrier for mounting an IC chip, comprising:
    an insulation film;
    a plurality of conductive leads formed on said insulation film, each of said conductive leads having an inner lead portion to be connected to a terminal of the IC chip, and an outer lead portion to be connected to a terminal of a mounting material; and
    ooze preventing means, made of an insulation material and formed on or in the vicinity of the outer lead portions of said conductive leads, for preventing an oozing of resin out from between leads when the IC chip is sealed with a resin.

11. A film carrier as claimed in claim 10, wherein said ooze preventing means extends intermittently around the periphery of the IC chip on the outer lead portions of said conductive leads.

12. A film carrier as claimed in claim 10, wherein said ooze preventing means extends continuously around the entire periphery of said IC chip on the outer lead portions of said conductive leads.

13. A film carrier as claimed in claim 10, wherein said ooze preventing means is spaced outwardly of the resin on the IC chip on the outer lead portions of said conductive leads.

14. A film carrier as claimed in claim 10, wherein said ooze preventing means is formed on both the top and bottom sides of the outer lead portions.

15. A film carrier as claimed in claim 14, wherein said ooze preventing means has a bottom part formed at the same time as a support ring for supporting said conductive leads is formed, and a top part formed on the top side of the outer lead portions.

16. A film carrier as claimed in claim 14, wherein said ooze preventing means is formed independently of a support ring for supporting said leads.

17. A film carrier as claimed in claim 15, wherein said ooze preventing means is made of the same material as the support ring.

18. A film carrier as claimed in claim 16, wherein said ooze preventing means is made of different material from the support ring.

* * * * *